(12) United States Patent
Dively et al.

(10) Patent No.: US 11,143,714 B1
(45) Date of Patent: Oct. 12, 2021

(54) LEAKAGE CURRENT PROTECTION SYSTEM FOR MARINAS

(71) Applicant: Marina Electrical Equipment, Inc., Williamsburg, VA (US)

(72) Inventors: Robert C. Dively, Williamsburg, VA (US); Alston G. Brooks, Grafton, VA (US)

(73) Assignee: MARINA ELECTRICAL EQUIPMENT, INC., Williamsburg, VA (US)

(*) Notice: Subject to any disclaimer, the term of this patent is extended or adjusted under 35 U.S.C. 154(b) by 0 days.

(21) Appl. No.: 17/356,790

(22) Filed: Jun. 24, 2021

Related U.S. Application Data (60) Provisional application No. 63/104,577, filed on Oct. 23, 2020.

(51) Int. Cl.
| | | |
|---|---|---|
| *H02H 3/00* | (2006.01) | |
| *G01R 31/52* | (2020.01) | |
| *G01R 15/18* | (2006.01) | |
| *G01R 15/12* | (2006.01) | |
| *G01R 19/165* | (2006.01) | |
| *H02H 9/08* | (2006.01) | |
| *B63H 21/17* | (2006.01) | |
| *H02H 9/02* | (2006.01) | |
| *H02H 11/00* | (2006.01) | |

(52) U.S. Cl.
CPC ............ *G01R 31/52* (2020.01); *G01R 15/12* (2013.01); *G01R 15/186* (2013.01); *G01R 19/165* (2013.01); *H02H 9/08* (2013.01); *B63H 21/17* (2013.01); *H02H 9/02* (2013.01); *H02H 9/021* (2013.01); *H02H 11/001* (2013.01)

(58) Field of Classification Search
None
See application file for complete search history.

(56) References Cited

U.S. PATENT DOCUMENTS

| | | | | |
|---|---|---|---|---|
| 5,748,008 | A | * | 5/1998 | Landreth .............. G01R 31/008 324/503 |
| 2016/0134102 | A1 | * | 5/2016 | Bieniek ................... H02S 50/00 363/55 |
| 2017/0227979 | A1 | * | 8/2017 | Drueke ..................... G05F 5/00 |

* cited by examiner

*Primary Examiner* — Stephen W Jackson
(74) *Attorney, Agent, or Firm* — Peter J. Van Bergen (57) ABSTRACT

A leakage current protection system includes a current transformer disposed about current-carrying conductors that extend from first ends to second ends. The first ends are coupled to load receptacles. The current transformer detects an aggregate differential current between the conductors. Each of a plurality of circuit breakers is coupled to the second ends of the conductors that are coupled to a corresponding one of the load receptacles. Each circuit breaker is coupled to a source of electrical power. A differential current monitor coupled to the current transformer generates a signal when the aggregate differential current exceeds a threshold current. Each of a plurality of shunt-trips coupled to the differential current monitor receives the signal. Each of the shunt-trips opens a corresponding one of the circuit breakers when the signal is received so that all of the circuit breakers are opened simultaneously.

14 Claims, 7 Drawing Sheets

LEAKAGE CURRENT PROTECTION SYSTEM FOR MARINAS

Pursuant to 35 U.S.C. § 119, the benefit of priority from provisional application 63/104,577, with a filing date of Oct. 23, 2020, is claimed for this non-provisional application.

FIELD OF THE INVENTION

The invention relates generally to leakage current monitors, and more particularly to a system that can be used in new or existing marine power pedestals to provide leakage current monitoring and reliable disconnection of the power pedestal from a marina's power source in the event of unacceptable levels of leakage current.

BACKGROUND OF THE INVENTION

Leakage currents in a marina's water environment are a substantial source of concern for marina owners, vessel owners, and vessel/marina visitors. Small amounts of current on the order of 100 milliamps (mA) or less leaking in the water at a marina are sufficient to cause injury and drowning when someone intentionally or unintentionally finds themselves in the water near docked vessels.

Leakage currents can occur when a vessel is plugged into a shore power receptacle provided at one of a marina's power pedestals. In general, leakage currents occur if a docked vessel has a faulty electrical appliance or system that allows small amounts of current to leak into the water rather than being returned to the pedestal's shore power receptacle via the vessel's shore power cord/conductors.

Testing for leakage currents can be carried out manually or can utilize a dedicated current monitoring system installed within each power pedestal at a marina. The manual approach is time consuming and must be employed each time a new vessel "plugs in" at a marina as well as on a regular schedule. Dedicated power pedestal-mounted current monitoring systems avoid the drawbacks of the manual approach. However, existing pedestal-mounted systems use ground fault interrupt (GFI) devices that are expensive and are often the source of failures that can permit the flow of leakage currents. Furthermore, existing pedestal-mounted systems are mounted within a pedestal at locations requiring the pedestal to be substantially disassembled for access and maintenance.

SUMMARY OF THE INVENTION

Accordingly, it is an object of the present invention to provide a system for protecting a marina from leakage currents.

Another object of the present invention is to provide a system for installation at each of a marina's power pedestals that automatically protects the marina from leakage currents.

Still another object of the present invention is to provide a marina leakage current protection system that is readily installed in a marina's existing power pedestals.

Yet another object of the present invention is to provide a marina leakage current protection system that is cost efficient and robust.

Other objects and advantages of the present invention will become more obvious hereinafter in the specification and drawings.

In accordance with the present invention, a leakage current protection system includes a current transformer adapted to have a plurality of current-carrying conductors pass there through. The conductors extend from first ends thereof to second ends thereof. The first ends are coupled to a plurality of load receptacles. The current transformer detects an aggregate differential current between the conductors. Each of a plurality of circuit breakers is coupled to the second ends of the conductors that are coupled to a corresponding one of the load receptacles. Each circuit breaker is coupled to a source of electrical power. A differential current monitor is coupled to the current transformer for generating a signal when the aggregate differential current exceeds a threshold current. Each of a plurality of shunt-trips coupled to the differential current monitor receives the signal and is actuated thereby. Each of the shunt-trips is coupled to a corresponding one of the circuit breakers to open the corresponding one of the circuit breakers when the signal is received thereby opening all of the circuit breakers simultaneously.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
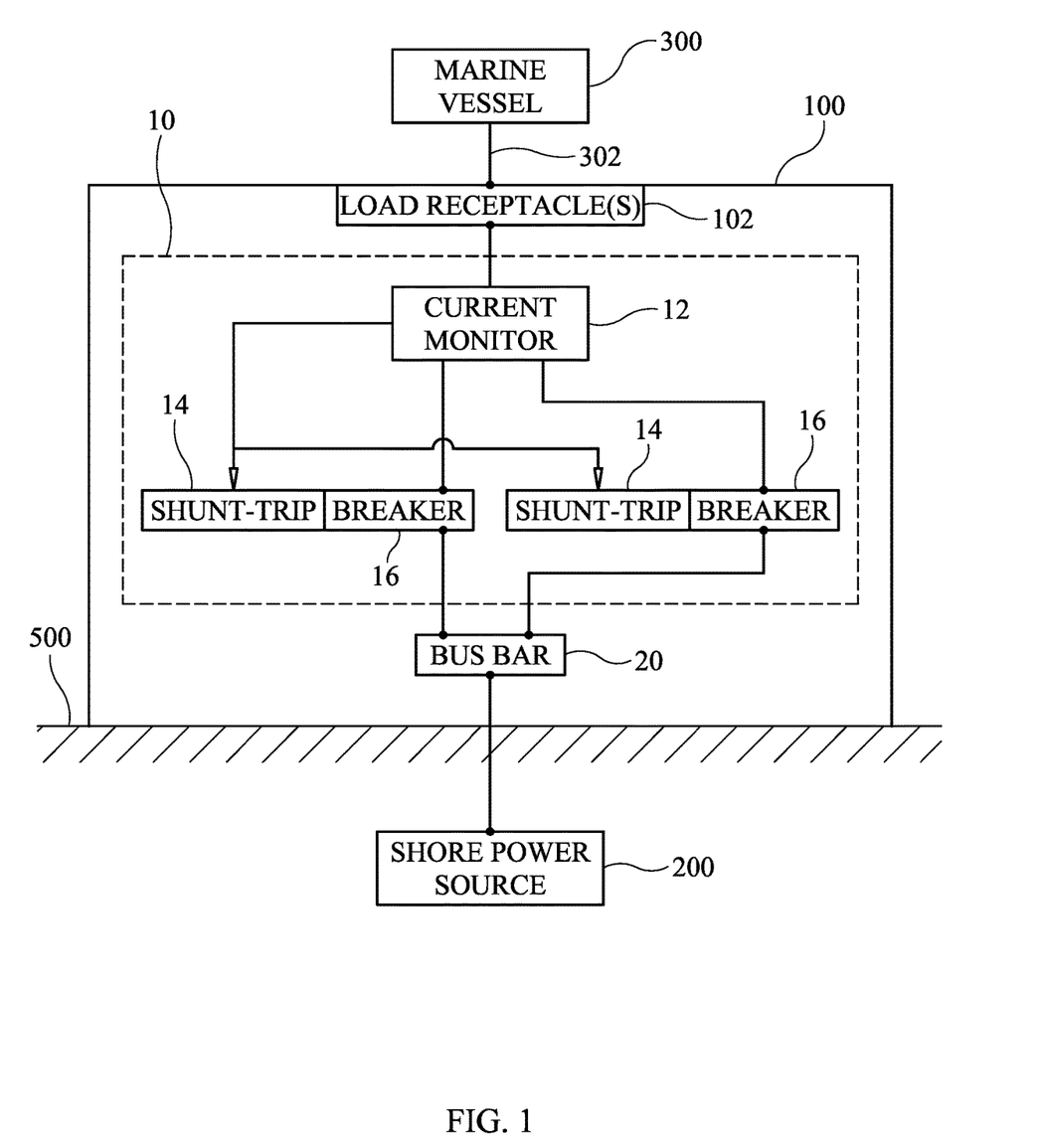
FIG. 1 is a block diagram of a power pedestal-mounted system for protecting a marina from leakage currents in accordance with an embodiment of the present invention.

Referring now to the drawings and more particularly to FIG. 1, a block diagram of a power pedestal-mounted system for protecting a marina from leakage currents in accordance with an embodiment of the present invention is illustrated within the dashed-line box referenced by numeral 10. Briefly, system 10 functions in a passive and automated fashion to detect a leakage current situation at a marina's power pedestal 100 and to very quickly disconnect the electrical power being supplied to pedestal 100. Pedestal 100 is typically fixed (e.g., bolted) to a location on a ground or ground-based surface 500. System 10 can be incorporated into existing or new power pedestals without departing from the scope of the present invention.

When no leakage currents of concern are detected, the electric power from a shore power source 200 is supplied via system 10 to a marine vessel 300 connected to the pedestal's load receptacle(s) 102 via a vessel-to-shore power cord 302. Connections between shore power source 200 and system 10 are generally made through use of a pedestal's bus bar 20. Briefly, when a leakage current of concern is detected, the electrical connection between shore power source 200 and load receptacle(s) 102 is disconnected.

As will be explained further below, the cost-effective design and reliable/robust nature of system 10 lends itself to being installed in most power pedestals found in marinas. The resulting safety and peace-of-mind provided by system 10 make it an indispensable component of a marina's power system. The entirety of system 10 can be mounted on a DIN rail (not shown) for ready installation in a power pedestal. For example, system 10 can be mounted in pedestal 100 such that its user-operated components are visually and physically accessible at an exterior location of pedestal 100. In some embodiments of the present invention, system 10 can be coupled to a unique retro-fit mounting panel that will be described further below. The inclusion of the retro-fit mounting panel further simplifies the system's installation, use, and servicing thereby providing additional labor and cost reductions. In all embodiments of the present invention, system 10 is a modular configuration constructed of relatively inexpensive components leading to lower costs in terms of both purchase and maintenance.

System 10 is electrically coupled between load receptacle(s) 102 (connected to a marine vessel) and shore power source 200. Receptacle(s) 102 can be one or more standard twist-lock receptacles to which a shore power cord 302 can be coupled. For example, many power pedestals provide 30 amp and 50 amp twist-lock receptacles or two 50 amp twist-lock receptacles. Accordingly, the remainder of the description assumes that two load receptacles 102 are provided in pedestal 100 such that two power cords 302 from one marine vessel 300 could simultaneously be coupled to the same pedestal 100.

System 10 includes a current monitor 12 and one or more combinations of a shunt-trip 14 and a circuit breaker 16. In general, the number of shunt-trip and breaker combinations is commensurate with the number of receptacles 102. For the power pedestal providing two receptacles 102 as shown, one shunt-trip/breaker combination is associated with each receptacle.

Figure 2:
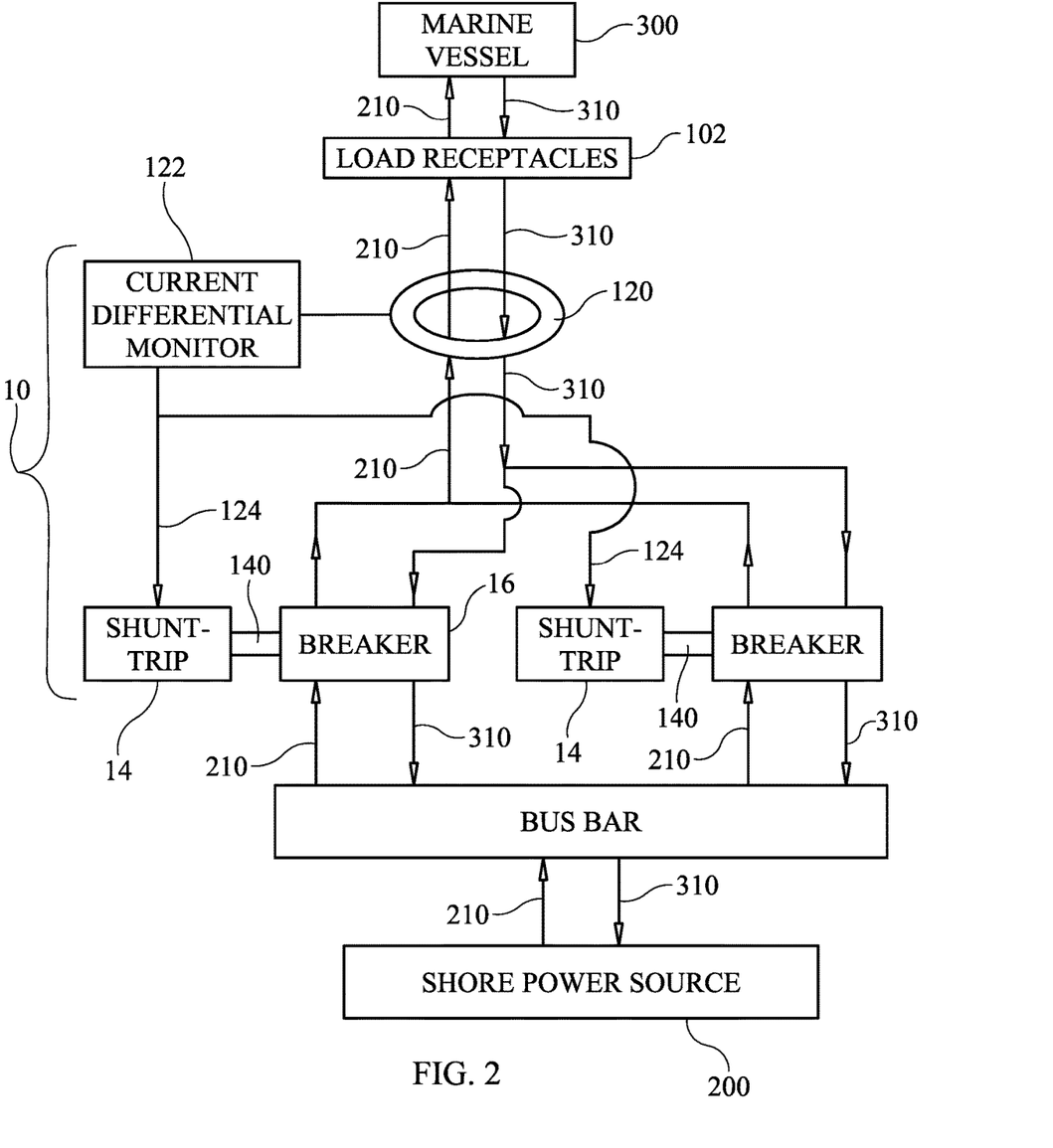
FIG. 2 is a schematic view of the current monitor and multiple shunt-trip and breaker combinations illustrating the current delivery and return paths in accordance with an embodiment of the present invention.

Referring additionally now to FIG. 2, current monitor 12 includes a current transformer 120 and a differential current monitor 122. Current transformer 120 monitors the current delivery path(s) 210 and current return path(s) 310 between shore power source 200 and marine vessel 300. Paths 210/310 begin at the connection between marine vessel 300 and receptacles 102 as provided by the conductors in shore power cord 302 (FIG. 1). For purpose of the present invention, all conductors defining paths 210/310 from receptacles 102 pass through current transformer 120 before being connected to breakers 16. Breakers 16 are connected by conductors to bus bar 20 that continue to define paths 210/310. Bus bar 20 is connected by conductors to shore power source 200 to define the last portions of paths 210/310.

Current transformer 120 disposed about the conductors (connecting receptacles 102 to breakers 16 and defining paths 210/310) detects the aggregate differential current between paths 210 and 310. The detected differential current is provided to differential current monitor 122 which, in turn, generates a signal whenever the aggregate differential current exceeds a pre-set current threshold (e.g., 30 mA, 100 mA, etc. depending on the application and/or safety regulations) indicative of an unsafe leakage current for the particular water environment. The signal indicative of an unacceptable leakage current is provided to each shunt-trip 14 via lines 124. In this way, all shunt-trip's 14 are actuated to cause their associated breakers 16 to assume their open position by a differential current indicative of a potentially dangerous leakage current.

Figure 4:
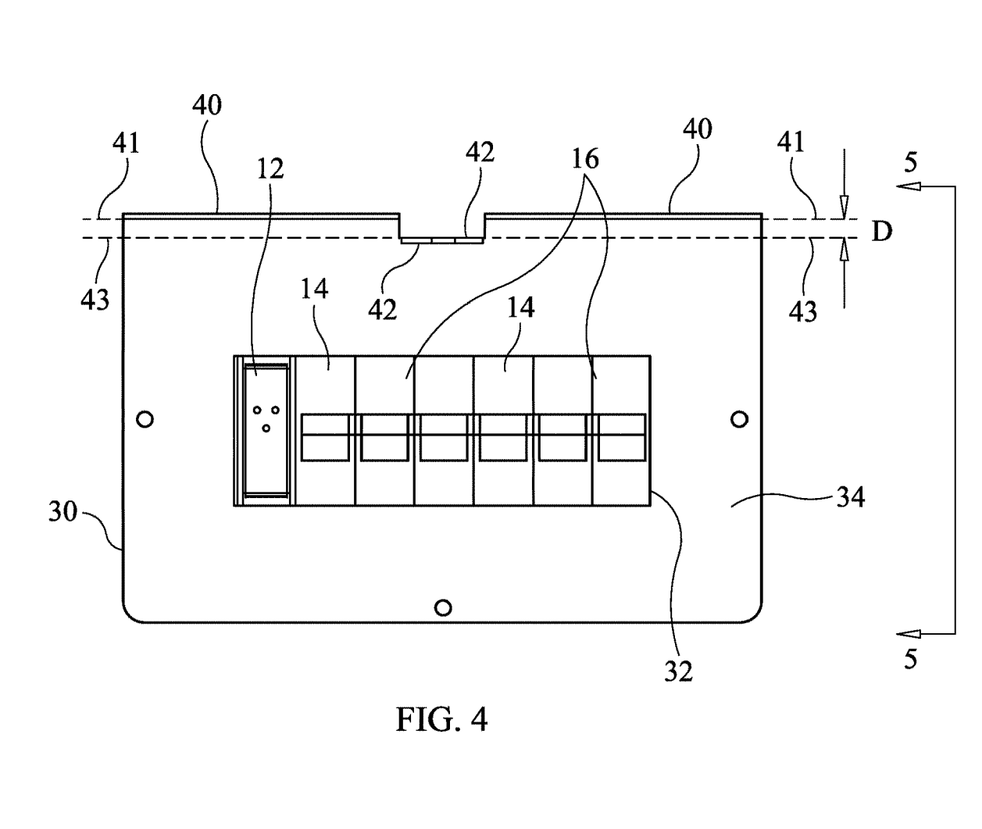
FIG. 4 is a front view of a retro-fit mounting panel and the user-operable portions of the electrical components of a power pedestal-mounted leakage current protection system in accordance with another embodiment of the present invention.

Each circuit breaker 16 can be a simple conventional breaker capable of being placed in its open-circuit position (i.e., to disconnect the flow of current) manually or by an actuated shunt-trip 14. When all breakers 16 are in their open-circuit position, breakers 16 disconnect the electrical connection between shore power source 200 and receptacle(s) 102. In accordance with the present invention, each shunt-trip 14 includes a mechanical feature (e.g., a movable pin or bar 140 as shown in FIG. 4) that is used to mechanically open its associated breaker 16 when the shunt-trip is activated. Each shunt-trip 14 is configured to be so-activated whenever current monitor 12 detects a threshold-exceeding delivery-to-return path differential current as described above.

When marine vessel 300 is connected to one or more of receptacle(s) 102, the current delivery path runs from shore power source 200 through bus bar 20, through breakers 16 and current monitor 12 to receptacle(s) 102, and on to vessel 300. The return path is the reverse of the delivery path. When current monitor 12 detects an unacceptable or excessive delivery-to-return path differential current as described above, each shunt-trip 14 is activated such that all breakers 16 of pedestal 100 are tripped thereby disrupting the current flow so that leakage currents can no longer be input to the surrounding water environment.

Figure 3:
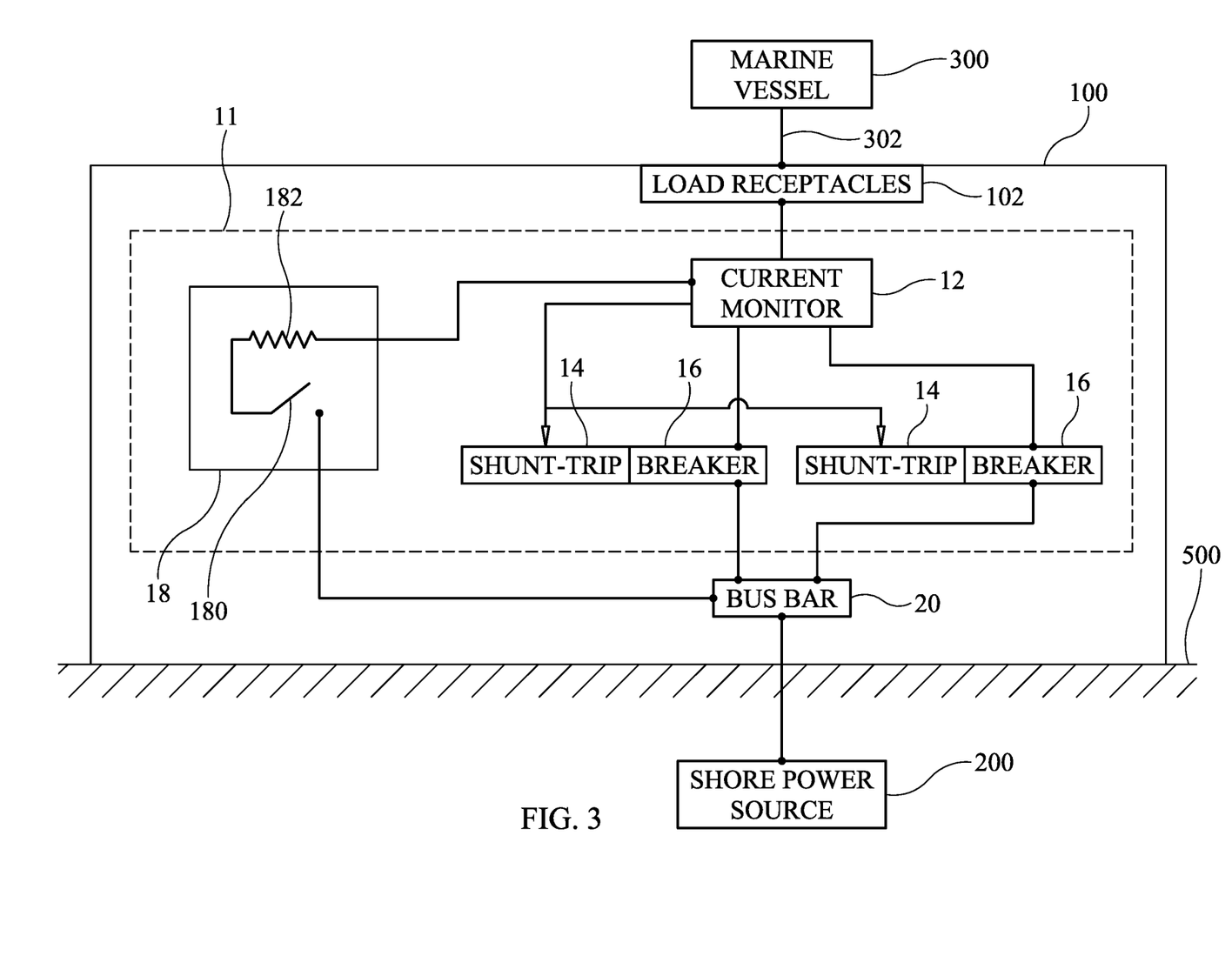
FIG. 3 is a block diagram of a power pedestal-mounted leakage current monitoring system to include an on-demand self-test circuit in accordance with another embodiment of the present invention.

Another embodiment of the present invention is illustrated in FIG. 3 where a power-pedestal mounted leakage current protection system is referenced within dashed-line box 11. In addition to the features and attributes of the above-described system 10, system 11 includes a self-test circuit 18 for testing the functionality of the combination of current monitor 12 along with each shunt-trip 14 and breaker 16. Self-test circuit 18 is positioned in pedestal 100 for on-demand access by a user. In some embodiments of the present invention, self-test circuit 18 can be incorporated into current monitor 12.

Self-test circuit 18 includes a switch 180 and trip-current-generating resistor 182 electrically in series with switch 180. Switch 180 is electrically coupled to bus bar 20 to receive power therefrom. Resistor 182 is electrically coupled to the differential current monitor of current monitor 12. During the system's normal leakage current monitoring mode, switch 180 is open (as shown). When a self-test is desired, a user closes switch 180 such that a voltage from bus bar 20 is applied across resistor 182. The supplied voltage and resistance of resistor 182 are configured to generate a test current that exceeds the above-described pre-set current threshold of current monitor 12 such that all shunt-trips 14 are actuated to cause their corresponding breakers 16 to open as described above. Diagnostics and maintenance of system 11 is required if any of breakers 16 do not trip during a self-test. To avoid inadvertent closing of switch 180, the switch can be a "push and hold" type of switch that requires a user to depress and hold the switch for a period of time (e.g., 3 seconds) before the switch will assume its closed position.

Each of current monitor 12 (with or without self-test circuit 18), shunt-trips 14, and breakers 16 can be configured as a modular unit to facilitate their attachment to a DIN rail (not shown). The DIN rail can be sized and configured for mounting in a desired location in an existing or new power pedestal. In other embodiments of the present invention, system 10 or 11 can further include a unique mounting panel for a retro-fit to existing power pedestals. The unique mounting panel for the system's electrical components will be explained further below with reference to FIGS. 4-6. The mounting panel simplifies installation, use, and servicing of the electrical components such that the panel is an integral part of the overall system contributing to the system's uniqueness and value.

Figure 5:
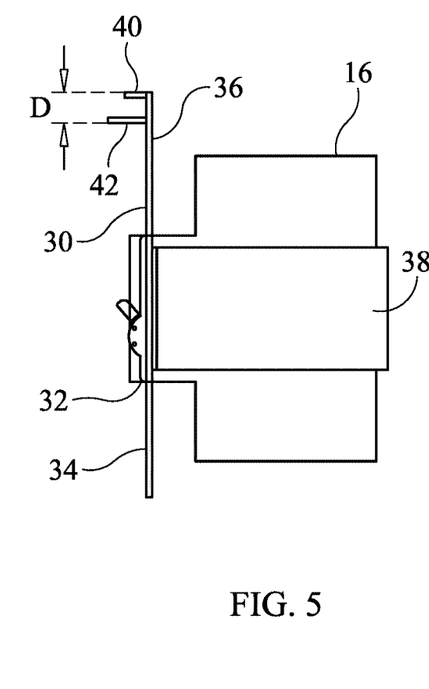
FIG. 5 is a side view of the retro-fit mounting panel and its strap taken along line 5-5 in FIG. 4.
Figure 6:
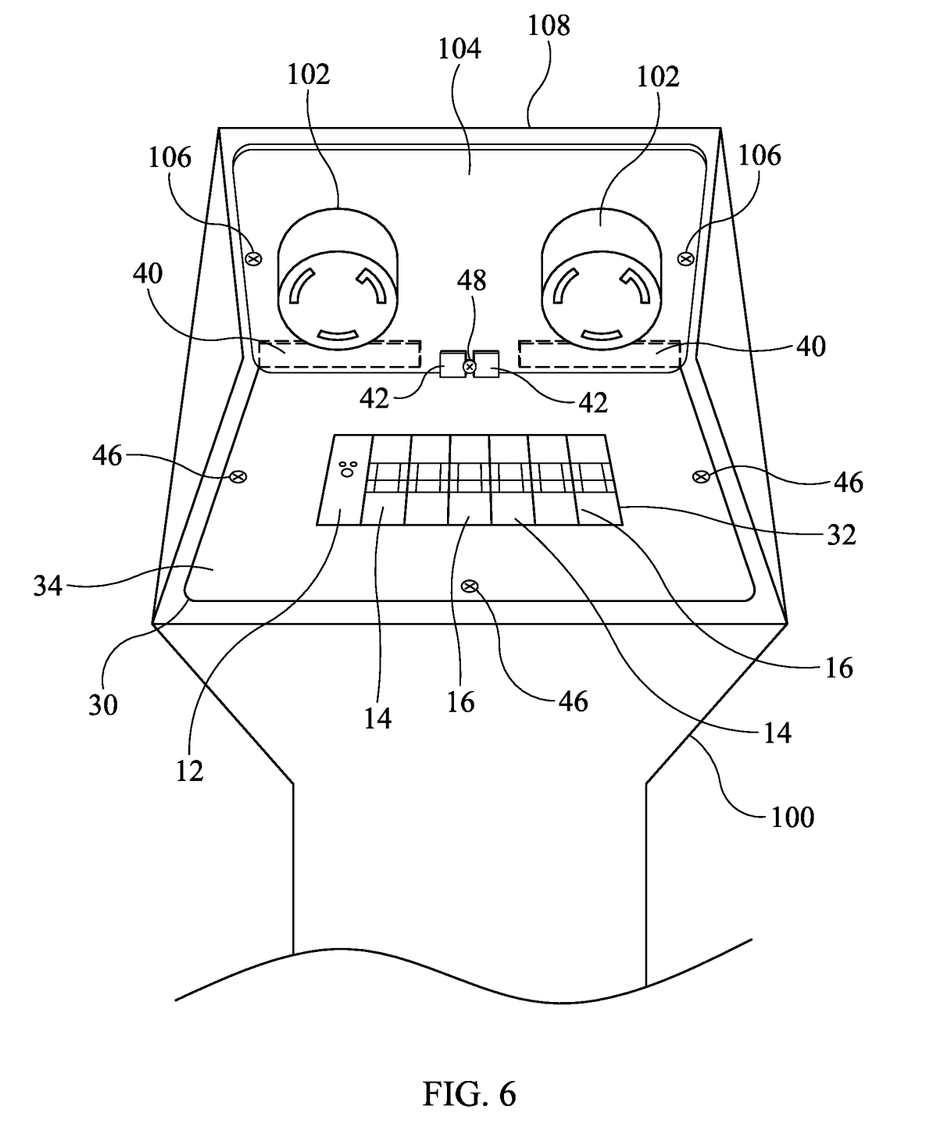
FIG. 6 is a front view of the top portion of a power pedestal with the retro-fit mounting panel-based system installed therein.

Referring simultaneously to FIGS. 4-6, a rigid mounting panel 30 in accordance with an embodiment of the present invention is illustrated in a plan view (FIG. 4), a side view (FIG. 5), and as it would be installed in a power pedestal 100 (FIG. 6). Panel 30 supports the mounting of current monitor 12 (except for its current transformer 120 disposed about the conductors as described above) as well as all shunt-trips 14 and breakers 16. More specifically, an elongated opening 32 in panel 30 supports and presents the user-accessible or readable portions of current monitor 12, all shunt-trips 14, and all breakers 16 at a front face 34 of panel 30. Electrical connections to current monitor 12, shunt-trips 14, and breakers 16 are accessible at the back face 36 of panel 30. Mechanically, current monitor 12, shunt-trips 14, and breakers 16 are retained in/against panel 30 by a strap 38 (FIG. 5) coupled to panel 30. The resulting assembly occupies a compact footprint with panel 30 providing the overall system with a unique structure that allows it to be integrated into existing power pedestals near a top thereof.

As shown in FIG. 6, the top region of an existing power pedestal 100 has its receptacles 102 mounted in a mounting plate 104 that is attached to pedestal 100 via screws 106. Receptacles 102 can be protected and accessed by lifting a weather-protecting cover (not shown) that is hingedly coupled to pedestal 100 along a top 108 thereof. Panel 30 incorporates unique features that allow plate 104 to remain unchanged, while also allowing panel 30 to be simply and securely coupled to pedestal 100 and plate 104. More specifically, the top edge of panel 30 terminates in two spaced-apart flanges 40 aligned in a first plane (indicated by dashed-line 41) and screw-supporting spaced-apart tabs 42 disposed between flanges 40. Tabs 42 are aligned in a second plane (indicated by dashed-line 43) that is substantially parallel to the first plane 41 occupied by flanges 40. Flanges 40 and tabs 42 extend perpendicular to front face 34 of panel 30. First plane 41 occupied by flanges 40 is separated from second plane 43 occupied by tabs 42 by a distance "D". Distance D is more than the thickness of plate 104 such that, at installation, plate 104 fits between flanges 40 and tabs 42 with flanges 40 and tabs 42 being disposed adjacent to opposing faces of the exposed lower edge of plate 104 as shown. Screws 46 are used to couple panel 30 to an internal wall (not shown) of pedestal 100 and screw 48 is used to couple panel 30 to the lower edge of plate 104 as screw 48 engages tabs 42 and plate 104. During the tightening of screw 48 against tabs 42, plate 104 is pressed into engagement with flanges 40 resulting in the secure engagement of panel 30 without requiring any modifications to pedestal 100 or plate 104.

The advantages of the present invention are numerous. A marina's leakage currents can be monitored passively and continuously at each of a marina's power pedestals. The continuous current delivery/return path monitoring and shunt-trip/breaker combinations described herein provide a cost-effective, reliable, and robust approach to leakage current protection that responds quickly to the detection of a leakage current situation. The system's use of simple and modular components allows it to be cost-effective to purchase and service. For embodiments that include the unique mounting panel, the system's electrical components are easily retro-fit into existing power pedestals at an easily used and serviced position without the need to modify existing pedestal structures. When leakage current protection in accordance with the present invention is incorporated into a power pedestal, the entire power pedestal becomes a leakage current protection system.

Any of the various embodiments of the leakage current protection system could also be installed at power pedestals found in other types of facilities to include recreational vehicle (RV) parks, campgrounds, or any other electrical connection panel associated with outside electrical equipment. In some embodiments of the present invention, the leakage current protection system described herein could be configured as a portable unit so that a vessel or vehicle can be tested prior to its connection to one of a marina's or RV park's power pedestals. For example and with reference to FIG. 7, a portable leakage current protection system is illustrated and is referenced generally by numeral 50.

Figure 7:
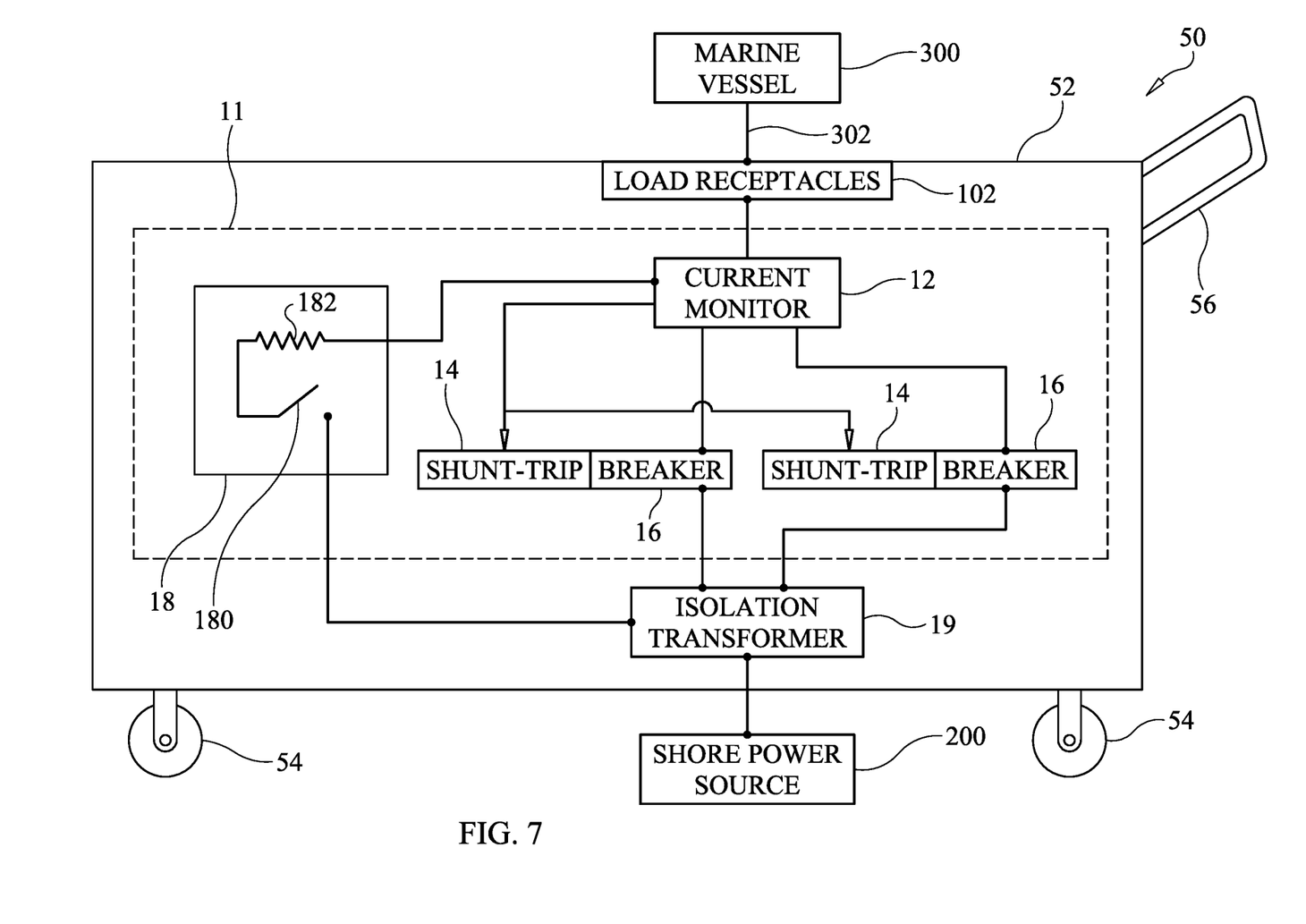
FIG. 7 is a block diagram of a portable system for protecting a marina from leakage currents in accordance with another embodiment of the present invention.

Portable system 50 will be described for its use in testing marine vessel 300 at a shore facility having shore power source 200. However, it is to be understood that portable system 50 could be used to test any vessel/vehicle that is to be connected to a facility's power source via one of the facility's power pedestals. Portable system 50 includes a housing 52 having wheels 54 and a handle 56 coupled to housing 52 such that portable system 50 is readily transported over a ground surface. Portable system 50 includes the above-described load receptacles 102 to accept connection to the marine vessel's shore power cord 302. One of the above-described system 10 or system 11 (as shown) is coupled to load receptacles 102 and is electrically separated from a connection to shore power source 200 by an isolation transformer 19. Isolation transformer 19 protects shore power source 200 from any leakage current faults associated with a vessel/vehicle being checked. Similar to the pedestal embodiment described above, system 11 can be mounted in housing 52 such that its user-operated components are visually and physically accessible at an exterior location of housing 52.

Figure 8:
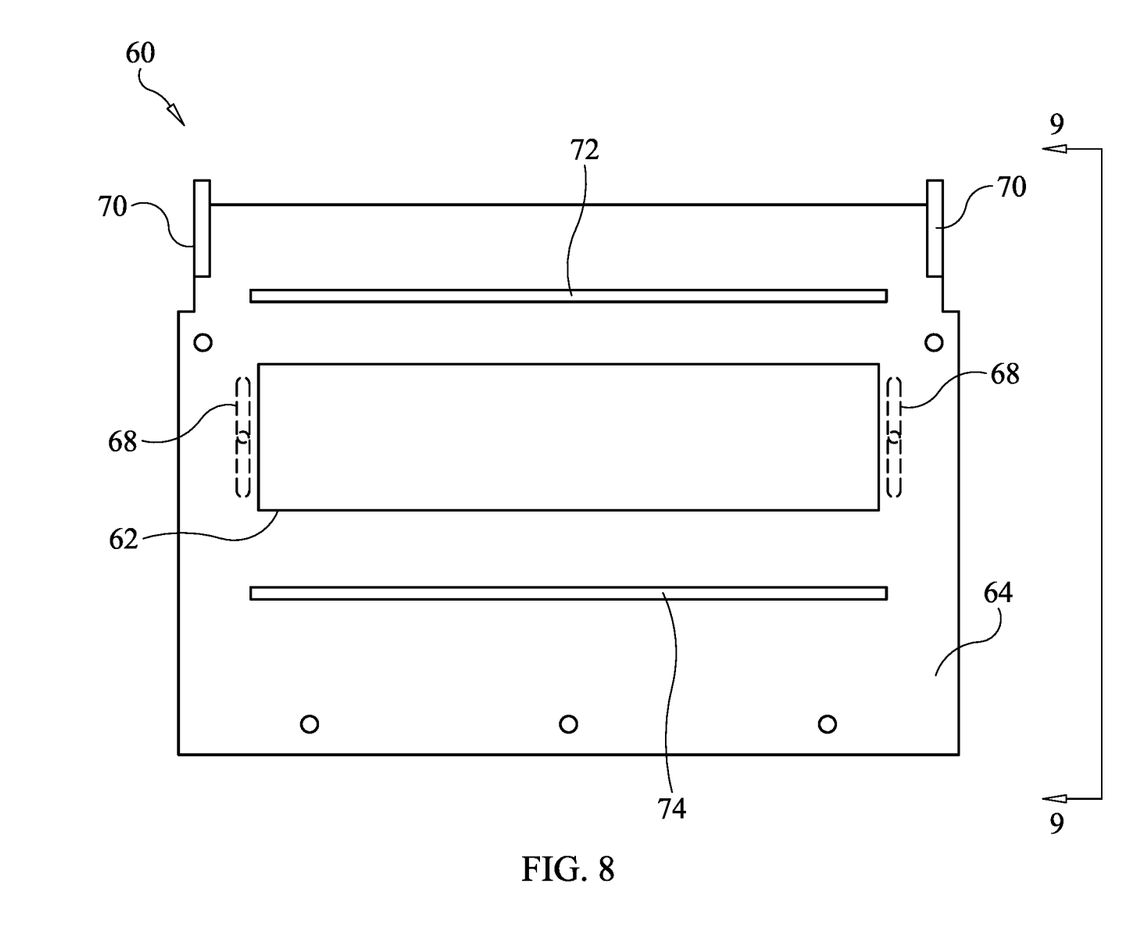
FIG. 8 is an isolated front view of a mounting panel for the electrical components of a power pedestal-mounted leakage current protection system in accordance with another embodiment of the present invention.
Figure 9:
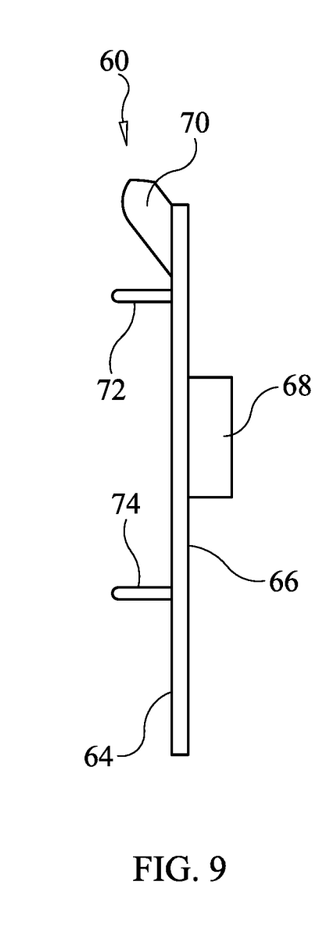
FIG. 9 is a side view of the mounting panel taken along line 9-9 in FIG. 8.

Although the invention has been described relative to specific embodiments thereof, there are numerous variations and modifications that will be readily apparent to those skilled in the art in light of the above teachings. For example, other embodiments of the present invention could include a rigid mounting panel 60 (illustrated in FIGS. 8-9) that protects the electrical components of the present invention from damaging amounts of moisture intrusion. Similar to the above-described panel 30 (FIGS. 4-6), panel 60 includes an elongated opening 62 that supports and presents the user-accessible or readable portions of the above-described electrical components (not shown but includes the current monitor, shunt-trips, and breakers) at a front face 64 of panel 60. Electrical connections to the electrical components are accessible at the back face 66 of panel 60. Mechanically, the electrical components can be retained in/against panel 60 by a DIN rail (not shown) coupled to tabs 68 provided at opposing longitudinal ends of opening 62. Tabs 68 can be an integral portion of panel 60. Panel 60 can also have integral hinge plates 70 at adjacent corners of panel 60 to provide for a hinged mounting of panel 60 in a power pedestal (not shown) such that panel 60 can be readily manipulated for use and service. At its front face 64, panel 60 also includes two ledges 72 and 74 that can be integral with panel 60. Ledges 72 and 74 are parallel to one another and extend perpendicularly away from front face 64. Each of ledges 72 and 74 extends in a spaced-apart and adjacent fashion along and beyond one of the longitudinal sides of opening 62. That is, each of ledges 72 and 74 is longer in length than that of opening 62 such that they extend beyond the short-side ends of opening 62. In this way, when panel 60 is in a vertical (or substantially vertical) orientation as it would be in a normal mounted scenario, moisture (e.g., water) raining down or splashing up is deflected by ledges 72/74 and directed away from opening 62 and, therefore, the electrical components accessible at opening 62. It is therefore to be understood that, within the scope of the appended claims, the invention may be practiced other than as specifically described.

What is claimed as new and desired to be secured by Letters Patent of the United States is:

1. A leakage current protection system, comprising:
    a current transformer adapted to have a plurality of current-carrying conductors pass there through, the conductors extending from first ends thereof to second ends thereof, the first ends adapted to be coupled to a plurality of load receptacles, said current transformer detecting an aggregate differential current between the conductors;
    a plurality of circuit breakers, each of said circuit breakers adapted to be coupled to the second ends of the conductors coupled to a corresponding one of the load receptacles, each of said circuit breakers further adapted to be coupled to a source of electrical power;
    a differential current monitor coupled to said current transformer for generating a signal when said aggregate differential current exceeds a threshold current; and
    a plurality of shunt-trips coupled to said differential current monitor for receiving said signal and being actuated thereby, each of said shunt-trips coupled to a corresponding one of said circuit breakers for opening said corresponding one of said circuit breakers when said signal is received, wherein said plurality of circuit breakers are opened simultaneously.

2. A leakage current protection system as in claim 1, further comprising a circuit coupled to said differential current monitor and adapted to be coupled to the source of electrical power, said circuit including a switch for opening and closing said circuit wherein, when said switch is operated for closing said circuit, said circuit generates a test current for receipt by said differential current monitor, said test current exceeding said threshold current wherein said plurality of circuit breakers are opened simultaneously.

3. A leakage current protection system as in claim 1, further comprising a rigid panel for mounting said differential current monitor, said shunt-trips, and said circuit breakers to be accessible at a front face of said panel, said panel having one edge thereof terminating in two spaced-apart flanges extending perpendicular to said front face, said flanges aligned in a first plane, said one edge further having two spaced-apart tabs disposed between said flanges and extending perpendicular to said front face, said tabs aligned in a second plane spaced apart from said first plane by a distance wherein said distance is adapted to be greater than a thickness of a mounting plate wherein said flanges and said tabs are disposed adjacent to opposing faces of the mounting plate when said one edge engages an edge of the mounting plate.

4. A leakage current protection system as in claim 1, further comprising a rigid panel having an elongated opening adapted to support mounting of said differential current monitor, said shunt-trips, and said circuit breakers for accessibility at a front face of said panel, said panel having a first ledge integral with said panel and extending perpendicular to said front face along and beyond one long side of said elongated opening, said panel having a second ledge integral with said panel and extending perpendicular to said front face along and beyond an opposing long side of said elongated opening, said first ledge being parallel to said second ledge.

5. A leakage current protection system as in claim 1, further comprising a housing adapted to support the load receptacles and adapted to have the source of electrical power available thereat, said housing providing visual and physical access to said differential current monitor, said shunt-trips, and said circuit breakers at a single location at an exterior of said housing.

6. A leakage current protection system as in claim 5, wherein said housing is adapted to be fixed to a ground location.

7. A leakage current protection system as in claim 5, further comprising:
    a plurality of wheels coupled to said housing; and
    a handle coupled to said housing.

8. A leakage current protection system, comprising:
    a current transformer adapted to have a plurality of current-carrying conductors pass there through, the conductors extending from first ends thereof to second ends thereof, the first ends adapted to be coupled to a plurality of load receptacles, said current transformer detecting an aggregate differential current between the conductors;
    a plurality of circuit breakers, each of said circuit breakers adapted to be coupled to the second ends of the conductors coupled to a corresponding one of the load receptacles, each of said circuit breakers further adapted to be coupled to a source of electrical power;
    a differential current monitor coupled to said current transformer for generating a signal when said aggregate differential current exceeds a threshold current;
    a plurality of shunt-trips coupled to said differential current monitor for receiving said signal and being actuated thereby, each of said shunt-trips coupled to a corresponding one of said circuit breakers for opening said corresponding one of said circuit breakers when said signal is received, wherein said plurality of circuit breakers are opened simultaneously;
    a circuit coupled to said differential current monitor and adapted to be coupled to the source of electrical power, said circuit including a switch for opening and closing said circuit wherein, when said switch is operated for closing said circuit, said circuit generates a test current for receipt by said differential current monitor, said test current exceeding said threshold current wherein said plurality of circuit breakers are opened simultaneously; and
    a rigid panel for mounting said differential current monitor, said shunt-trips, and said circuit breakers to be accessible at a front face of said panel.

9. A leakage current protection system as in claim 8, where said panel has one edge thereof terminating in two spaced-apart flanges extending perpendicular to said front face, said flanges aligned in a first plane, said one edge further having two spaced-apart tabs disposed between said flanges and extending perpendicular to said front face, said tabs aligned in a second plane spaced apart from said first plane by a distance wherein said distance is adapted to be greater than a thickness of a mounting plate wherein said flanges and said tabs are disposed adjacent to opposing faces of the mounting plate when said one edge engages an edge of the mounting plate.

10. A leakage current protection system as in claim 8, wherein said panel has an elongated opening adapted to support mounting of said differential current monitor, said shunt-trips, and said circuit breakers for accessibility at a front face of said panel, said panel having a first ledge integral with said panel and extending perpendicular to said front face along and beyond one long side of said elongated opening, said panel having a second ledge integral with said panel and extending perpendicular to said front face along and beyond an opposing long side of said elongated opening, said first ledge being parallel to said second ledge.

11. A leakage current protection system for a facility supplying electrical power for vessels, comprising:
  a housing;
  a plurality of twist-lock load receptacles coupled to said housing;
  a bus bar mounted in said housing, said bus bar adapted to have a facility's electrical power coupled thereto;
  a plurality of current-carrying conductors disposed within said housing and coupling each of said receptacles to said bus bar;
  a current transformer disposed about said current-carrying conductors from each of said receptacles, said current transformer detecting an aggregate differential current between all of said current-carrying conductors;
  a plurality of circuit breakers mounted in said housing, each of said circuit breakers disposed between said current transformer and said bus bar and electrically coupled to a corresponding one of said receptacles and said bus bar;
  a differential current monitor mounted in said housing and coupled to said current transformer for generating a signal when said aggregate differential current exceeds a threshold current; and
  a plurality of shunt-trips mounted in said housing and coupled to said differential current monitor for receiving said signal and being actuated thereby, each of said shunt-trips coupled to a corresponding one of said circuit breakers for opening said corresponding one of said circuit breakers when said signal is received wherein said plurality of circuit breakers are opened simultaneously.

12. A leakage current protection system as in claim 11, further comprising a circuit coupled to said differential current monitor and said bus bar, said circuit including a switch for opening and closing said circuit wherein, when said switch is operated for closing said circuit, said circuit generates a test current for receipt by said differential current monitor, said test current exceeding said threshold current wherein said plurality of circuit breakers are opened simultaneously.

13. A leakage current protection system as in claim 11, wherein said housing comprises a power pedestal having a mounting plate with an exposed edge, and further comprises a rigid panel for mounting said differential current monitor, said shunt-trips, and said circuit breakers to be accessible at a front face of said panel, said panel having one edge thereof terminating in two spaced-apart flanges extending perpendicular to said front face, said flanges aligned in a first plane, said one edge further having two spaced-apart tabs disposed between said flanges and extending perpendicular to said front face, said tabs aligned in a second plane spaced apart from said first plane by a distance wherein said distance is greater than a thickness of said mounting plate, and wherein said flanges and said tabs are disposed adjacent to opposing faces of said mounting plate when said one edge of said panel engages said exposed edge of said mounting plate.

14. A leakage current protection system as in claim 11, further comprising a rigid panel having an elongated opening for supporting mounting of said differential current monitor, said shunt-trips, and said circuit breakers for accessibility at a front face of said panel, said panel having a first ledge integral with said panel and extending perpendicular to said front face along and beyond one long side of said elongated opening, said panel having a second ledge integral with said panel and extending perpendicular to said front face along and beyond an opposing long side of said elongated opening, said first ledge being parallel to said second ledge.

\* \* \* \* \*